TRANSISTOR WITH COMPENSATED DEPLETION-LAYER CAPACITANCE

Filed May 19, 1966

United States Patent Office 3,504,203
Patented Mar. 31, 1970

3,504,203

TRANSISTOR WITH COMPENSATED DEPLETION-LAYER CAPACITANCE

George W. Haines, Williamstown, Mass., assignor to Sprague Electric Company, North Adams, Mass., a corporation of Massachusetts Filed May 19, 1966, Ser. No. 551,341
Int. Cl. H03k *19/08*
U.S. Cl. 307—299 12 Claims

ABSTRACT OF THE DISCLOSURE

A P-N junction having substantially the same depletion-layer capacitance as that of one transistor is connected in a back to back arrangement between the base of the one transistor and the collector of another so as to compensate for the depletion-layer capacitance of the one transistor.

This invention relates to transistor units and more particularly to a transistor unit having compensated depletion-layer capacitance and a method of making the same.

The synthesis of various solid state networks, such as amplifiers, is severely limited and unduly complicated by the capacitance of the collector depletion-layer ($C_c$) of the transistor. In cascaded amplifiers, for example, this capacitance in each stage limits the overall bandwidth and results in a non-unilateral device.

Feedback through this capacitance modifies all the time constant locations. Accordingly, the gain bandwidth product is severely limited under operating conditions of reasonable voltage gain due to the Miller effect narrow banding. In addition, the inherent feedforward characteristics of the capacitance provide undesirable phase contributions to the signal transfer functions. The latter, which is a transmission zero of the device transfer function located in the right-half complex frequency plane, serves to limit the amount of feedback that can be applied around cascaded amplifiers without oscillation.

Precisely tuned capacitors have been employed in vacuum tube amplifiers to reduce the undesirable effects of analogous tube capacitances. This solution, however, although it provides increased gain bandwidth product even with reasonable mismatch between the inherent and the compensating capacitance (since accurate pole-zero cancellation is not necessary to greatly reduce $C_c$ effects throughout the first order frequency region), does not provide a straightforward transfer function. Stated otherwise, non-unilateral effects are not appreciably reduced unless the indicated capacitances are matched to a degree generally unattainable in the prior art. Thus, matching could not be maintained over a wide frequency range, or under varied thermal and bias conditions.

It is an object of this invention to provide a transistor unit having a compensated depletion-layer capacitance.

It is another object of this invention to provide a transistor unit having more unilateral characteristics than previously obtained.

It is a further object of this invention to provide a transistor unit in which a compensating junction substantially matches the transistor depletion-layer capacitance over a wide frequency range and under varied thermal and bias conditions.

It is a still further object of this invention to provide a process for making a compensated transistor unit.

It is a still further object of this invention to provide a pair of transistors having a pair of compensating junctions which respectively compensate for the depletion-layer capacitance of each transistor.

These and other objects of the invention will be more apparent upon consideration of the following specification taken in conjunction with the accompanying drawing in which.

Figure 1:
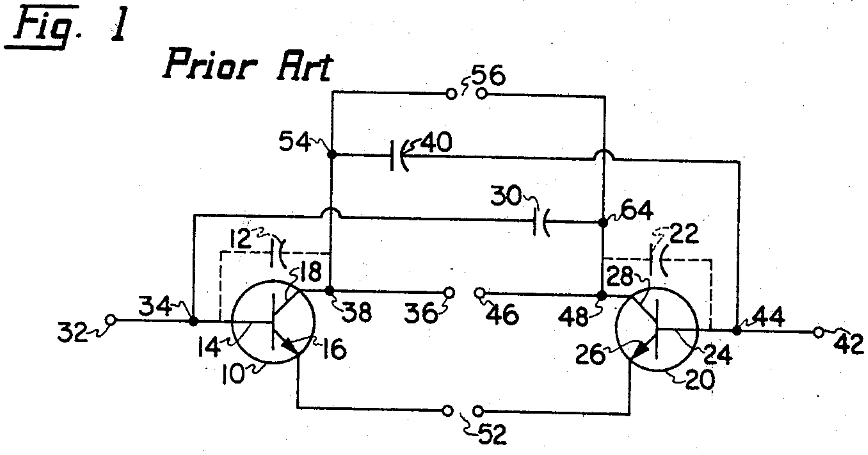
FIGURE 1 is a schematic diagram of transistor unit employing compensating capacitors in accordance with the prior art.

In its broadest scope a transistor unit produced in accordance with the invention comprises a pair of transistors and at least one compensating junction. The compensating junction is connected between the base of one transistor and the collector of the other so as to compensate for the depletion-layer capacitance of said one transistor.

Briefly the method of making a compensated transistor unit comprises the steps of forming two transistors and at least one compensating junction, and connecting the compensating junction to the base of one and the collector of the other transistor to compensate for the collector depletion-layer of said one transistor.

In a more limited sense, the method of making a compensated transistor unit includes the steps of simultaneously forming a pair of collector-base junctions in two isolated pockets, forming an emitter in each base region to provide a transistor pair in each pocket, and connecting the bases of the transistor pair of one pocket to the bases respectively of the transistor pair of the other pocket.

A transistor unit provided in accordance with the method described, comprises a pair of transistors and a pair of compensating collector-base junctions. The collector-base junction of each transistor has substantially the same impurity profile and area as that of its compensating junction. These junctions are interconnected such that the capacitance of the collector depletion-layer of each transistor is compensated for by the capacitance of the compensating junctions, respectively.

The base of one transistor is connected to the base of its compensating junction whereas its collector is connected to the collector of the second compensating junction. Similarly, the base and collector of the other transistor are connected respectively to the base of its compensating junction and the collector of the first compensating junction.

In one embodiment, the connection of the collector of one transistor to the collector of the second compensating junction, which compensates for the other transistor, is provided by a common impurity region. Thus the collector-base junction of said one transistor and the second compensating junction, although separate junctions, are simultaneously formed in a common collector region. This construction provides substantially the same impurity profile for each transistor collector-base junction and its compensating junction, while allowing a variation in junction area and, in addition, insures thermal tracking.

A symmetrical transistor unit is also provided in accordance with the invention by providing each base region of the compensating junctions with its own emitter. In this way, the collector-base junction of a second transistor pair compensates for that of the first pair.

Either pair is then available for use as transistors, while the remaining pair provides compensation. Improved matching under varied bias conditions may also be maintained in this case by providing a bias current through the compensating transistors.

Referring now to the drawing and to FIGURE 1 in particular wherein a pair of transistors 10 and 20 are shown in connection to each other and compensating capacitors 30 and 40 in accordance with the prior art.

Each compensating capacitor 30 and 40 is connected, with appropriate polarity, between the base of the transistor for which it compensates and the collector of the other transistor. Thus capacitor 30 is connected on one side to terminal 34, and hence to base 14 of transistor 10, and on the other side to terminal 64 and through it to collector 28 of transistor 20. Accordingly, capacitor 30 compensates for the depletion-layer capacitance, or $C_c$, 12 of transistor 10 at one particular frequency, temperature and operating point. Similarly, capacitor 40 is connected to base 24 of transistor 20 and the collector 18 of transistor 10, and compensates for the $C_c$, 22 of the former.

The circuit shown may be operated as an amplifier unit or the like by connection of appropriate resistors. Terminals 32 and 42 are provided for signal input and terminals 52 and 56 are employed for D.C. bias. Terminals 36 and 46 represent output terminals. It should be understood, however, that terminals 54 and 64, or 38 and 48, or 36 and 46 may be employed instead of terminals 56 for both D.C. bias and signal output.

Figure 2:
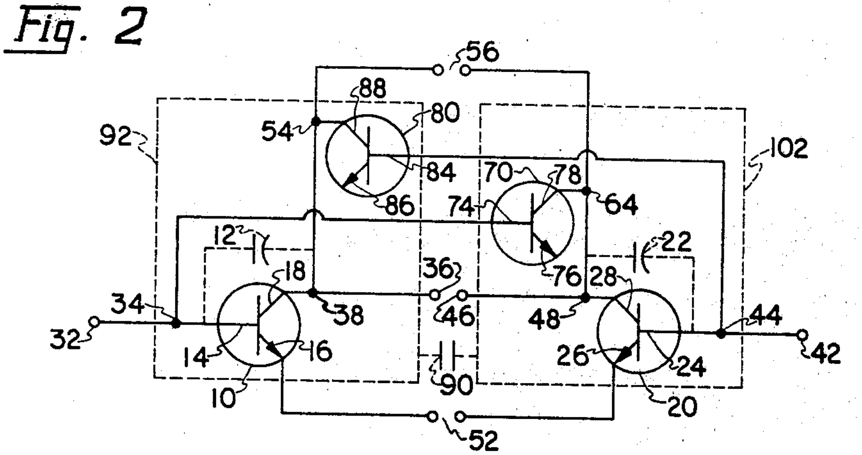
FIGURE 2 is a schematic diagram of a transistor unit employing compensating junctions in accordance with the invention.

In FIGURE 2, in which a schematic of the preferred embodiment is shown, the capacitors 30 and 40 are replaced by transistors 70 and 80, each of which have emitters, 76, 86, bases 74, 84 and collectors 78, 88 respectively. In this configuration the depletion-layer capacitance (not shown) of transistor 70 compensates for the $C_c$, 12 of transistor 10 in a similar but for far more efficient manner than capacitor 30. In the same way, the $C_c$ of transistor 80 is employed to compensate for that of transistor 20.

Base 74 of transistor 70 is connected to base 14 of transistor 10 and collector 78 of the former is connected to collector 28 of transistor 20, in a back to back arrangement of the collector-base junctions, so that the $C_c$ (not shown) of transistor 70 compensates for that of transistor 10. Similarly, base 84 and collector 88 of transistor 80 are connected respectively to base 24 of transistor 20 and collector 18 of transistor 10 so as to compensate for the $C_c$, 22 of the former.

Unilateral characteristics are insured in the transistor unit by providing substantially the same impurity profile and area for the collector-base junction of each transistor 10 and 20 and its compensating junction; namely the collector-base junctions, respectively, of transistors 70 and 80.

Since the junctions are substantially identical, the match of mating junctions will be maintained over a wide frequency range and under varied thermal and bias conditions. It should be understood, however, that even though the compensating junction will thermally track that of the transistor for which it compensates, to do so both junctions must be maintained at the same temperature. Thus, for most efficient operation mating junctions should be joined by a material having high thermal conductivity, or otherwise maintained at substantially the same temperature.

As indicated, it is desirable to provide similar impurity profiles and area for mating junctions, (for example, the collector base junction of transistor 10 and transistor 70), however, one set of mating junctions need not be the same as the other set. Thus the pertinent junctions of transistor 10 and 70 should be substantially the same in profile and area but different from that of transistors 20 and 80 which are also substantially identical. Advantageously transistor 10 and 70 could differ from transistor 20 and 80 as to impurity profile or area of the collector-base junction, or both.

The emitters 76 and 86, which adjoin the compensating junctions, are not connected in this circuit since only the compensating base-collector junctions are in use. Emittters 76 and 86 provide, however, a more symmetrical unit. Thus transistor 70 may be interchanged with transistor 20 by means of different external connections. More importantly, emitters 76 and 86 could be employed with the respective bases and collectors of transistor 70, 80 to conduct a current through these to further enhance the capacitive match of mating junctions.

In the preferred embodiment, transistors 10 and 80 are provided in one semiconductor pocket 92, and transistors 20 and 70 are provided in a second semiconductor pocket 102. Both pockets 92 and 102 are substantially the same but isolated from each other by a dielectric, such as a P-N junction, oxide or the like, which results in a parasitic capacitance 90 as shown in FIGURE 2.

Figure 3:
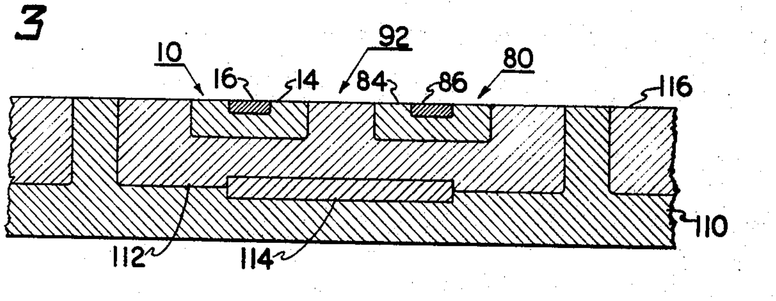
FIGURE 3 is a view in cross section of a portion of a transistor unit produced in accordance with a preferred embodiment of the invention.

For convenience, a cross section of only one pocket 92 is shown in FIGURE 3 since both pockets are identical. In the preferred embodiment, for example, pocket 102 would be directly in front of or behind pocket 92 as shown. The pockets could, of course, be placed end to end. That is, pocket 102 could be to the left or right of illustrated pocket 92, however, since each pocket contains two base and two emitter regions they are longer than they are wide and a more compact device, or better form factor, is provided by a side by side configuration.

The transistor unit, as illustrated in FIGURE 3 is fabricated by first forming isolated pockets 112 of one conductivity type, for example N-type, in a semiconductor body 110 of opposite P-type conductivity. A high conductivity N-type zone 114 is also provided at the bottom of the pocket.

This isolated pocket construction can be provided in any conventional manner in silicon or other semiconductive material. For example, epitaxial layer construction is suitable. Thus, any technique which provides electrically isolated regions in good thermal contact with a substrate 110 would be suitable.

Thus, although P-N junction isolation is illustrated, in FIGURE 3, oxide, air, or other electrical insulation could be employed, since the pocket formation and its isolation is pertinent to the invention only as regards the reduction of the parasitic capacitance 90 which exists between pockets. However, this capacitance should be minimized, since it ultimately limits the gain-bandwidth product of the transistor unit.

After suitable pockets have been prepared, a masking coat, not shown, such as silicon oxide or the like is formed over the pocket surface 116 and two openings are made to each pocket. Thereafter two P-type base regions are simultaneously diffused in each pocket to provide two collector-base junctions having substantially the same impurity profile and area.

Thus base regions 14 and 84 are diffused in pocket 92 simultaneously with base regions 24 and 74 in pocket 102 (not shown). The surface 116 is again masked and emitter openings provided. Thereafter emitter regions, 16, 26, 76 and 86 are diffused in their respective base regions.

External contacts (not shown) are then provided to complete the transistor unit. Thus base 14 is connected to base 74 by a short conductive strip of gold, silver, nickel or the like, and base 24 is similarly connected to base 84. A contact is also provided to each emitter and the collector region 112 of each pocket.

For the unit schematically illustrated in FIGURE 2, contacts may be extended from each collector pocket 112 to terminals 56. A contact may also be extended from each emitter region, with those from emitter 16 and 26 being terminated at terminals 52. The connection of collector 18 to collector 88, and 28 to 78 are provided, of course, by the common impurity region 112. Zone 114 of this region insures that the collector connection will be of low resistance.

In this way a symmetrical unit of four transistors is provided. One transistor of each pocket, depending upon the external contacts or connections, may be employed to compensate for the depletion-layer capacitance of one transistor of the adjacent pocket. Thermal tracking is excellent in this configuration since the compensating junctions are embedded in the same body and are separated only by a short path of thermally conductive but electrically isolating material.

Various means of providing the desired compensating junctions (junctions having substantially the same profile and area) are possible. For example, each transistor 10, 20, 70 and 80 could be formed in its own pocket. Furthermore, since only the profile and area of mating junctions need be substantially the same, transistors 10 and 20 could differ considerably from 70 and 80.

In the embodiment described, for example, the oxide openings employed to make bases 14 and 74 could be much larger than those utilized for bases 24 and 84 so that the former would have larger junction areas. In a similar fashion, the profile of transistors 10 and 70 could be made different from those of 20 and 80 by employing different impurities, or by other means such as separate diffusion or the like.

Although the isolated transistor pair topology described above consists of four distinct transistors, the internal collector connection through the low resistivity buried layer and the low resistance base interconnections yields characteristics suitable for differential amplifier fabrication which is undistinguishable from a transistor pair, except for vastly improved performance.

For use as an amplifier, appropriate load resistors must be provided of course. In this way, the described unit may be utilized in various modes of operation. For example, it could be employed in either double ended or single ended modes. In the latter case of course, only one of the compensating junctions is required.

As an example of a compensated unit, fabricated in the isolated pair topology, two uniform N-type collector pockets of ¼ ohm-cm. resistivity, 4 by 6 mils, by 6 microns deep were formed over a 10 ohms-cm. P-type substrate. A 15 ohms per square, N-type buried layer was provided at the bottom of the collector regions and ½ mil wide, P-type isolation having a surface concentration of the order of $10^{19}$ atoms/cm.$^3$ was provided around each pocket.

Thereafter, two P-type base regions 1¾ mils wide by 2 mils long and having a surface concentration of $10^{19}$ atoms/cm.$^3$ were formed to a depth of 2 microns, so as to provide two collector-base junctions in each pocket. Then an N-type emitter ¼ mil by 1½ mil by 1½ microns deep, having a surface concentration of $10^{21}$ atoms/cm.$^3$ were formed within each base region.

External contacts of aluminum were employed to connect each base of one pocket with a corresponding base of the adjacent pocket. Contacts from each collector pocket and from each of the emitters were also extended.

The unit was then utilized with appropriate load resistors as a differential amplifier (one emitter of each pocket was not connected). The amplifier provided a gain-bandwidth product of 700 mHz. at a differential voltage gain of 60 as compared to 200 mHz. for an uncompensated device. In addition, at a bandwidth of 10 mHz. the gain-bandwidth product was 720 mHz. as compared to 130 mHz. for conventional differential units.

In the described fabrication, the P-N isolation provided a parasitic capacitance of 1.5 pf. between isolated pairs, which is a limiting factor. Thus, the theoretical limits of bandwidth may be approached over a wide range of voltage gain by utilizing other isolation techniques, such as silicon dioxide, silicon nitride and the like which can reduce the collector capacitance by an order of magnitude.

As indicated, many different modifications are possible. For example, both N-P-N and P-N-P structures may be provided. Germanium, silicon and other semiconductor materials may also be employed. Thus it should be understood that the invention is not to be limited except as in accordance with the appended claims.

What is claimed is:

1. A compensated differential amplifier stage comprising a pair of amplifying transistors, and at least a first compensating junction, each of said transistors having a collector-base junction formed by a base region of one conductivity type and a collector region of the other conductivity type, at least one of said transistors adapted for application of a signal input to the base thereof, said one transistor having a depletion-layer capacitance capable of modifying the amplification of said signal by said one transistor, said compensating junction formed by one region of said one conductivity type and another region of said other conductivity type, said compensating junction having an impurity profile substantially the same as that of the collector-base junction of said one transistor, and said compensating junction electrically connected directly between the base of said one transistor and the collector of the other with its one region in connection to said base of said one transistor and its other region in connection to said collector of said other transistor such that the depletion-layer capacitance of said compensating junction provides compensation for said depletion-layer capacitance of said one transistor.

2. A transistor unit as claimed in claim 1 wherein said one transistor and said first compensating junction are thermally connected by electrically isolating material having high thermal conductivity for providing thermal tracking of said one transistor by its compensating junction.

3. A transistor unit as claimed in claim 1 wherein the impurity profile and area of the collector-base junction of said one transistor is substantially the same as that of said first compensating junction.

4. A transistor unit as claimed in claim 3 wherein said collector of said other transistor and said other region of said compensating junction are a common impurity region of a semiconductive wafer.

5. A transistor unit as claimed in claim 1 wherein said other transistor is also adapted for application of a signal to the base thereof for double ended operation of said amplifier stage, said other transistor also having a depletion-layer capacitance capable of modifying the amplification of said signal by said other transistor, and said unit including a second compensating junction formed by one region of said one conductivity type and another region of said other conductivity type, said second compensating junction electrically connected directly between the base of said other transistor and the collector of said one transistor with its one region in connection to said base of said other transistor and its other region in connection to said collector of said one transistor such that the depletion layer capacitance of said second compensating junction provides compensation for said depletion-layer capacitance of said other transistor, and the impurity profile of the collector-base junction of said other transistor is substantially the same as that of its compensating junction.

6. A transistor unit as claimed in claim 5 wherein the impurity profile and area of the collector-base junction of both transistors and that of both compensating junctions is substantially the same.

7. A transistor unit as claimed in claim 5 wherein the area of the collector-base junction of said one transistor and its compensating junction is substantially different from the area of the collector-base junction of said other transistor and its compensating junction.

8. A transistor unit as claimed in claim 5 wherein said compensating junctions are the collector-base junctions respectively of a second pair of transistors.

9. A differential amplifier network comprising: a pair of transistors; input terminals respectively connected to the base regions of each transistor for application of a signal thereto; bias terminals connected to the emitter and collector regions of each transistor for application of a DC bias for amplification of the signal applied to said transistors; a pair of output terminals respectively connected to the collector region of each transistor; and at least one compensating junction formed by a region of said one conductivity type and a region of said other conductivity type, said compensating junction connected directly between the base of said one transistor and the collector of the other transistor with its region of said one conductivity in connection to said base of said one transistor and its region of said other conductivity in connection to said collector of said one transistor so that its depletion layer capacitance provides compensation for the collector depletion-layer capacitance of said one transistor.

10. The network of claim 9 wherein said compensating junction is a P–N junction having an impurity profile substantially the same as the impurity profile of the collector-base junction of said one transistor.

11. The network of claim 10 including a bias connection to said junction adapted to pass a current therethrough for providing improved matching of said junction to said one transistor.

12. The network of claim 10 including a second compensating P–N junction connected directly between the base of said other transistor and the collector of said one transistor with its region of one conductivity type in connection to the base of said other transistor and its region of other conductivity type in connection to the collector of said one transistor such that its depletion-layer capacitance provides compensation for the collector depletion-layer capacitance of said other transistor.

References Cited

UNITED STATES PATENTS

| | | | |
|---|---|---|---|
| 3,198,963 | 8/1965 | Halsted | 307—263 X |
| 3,292,014 | 12/1966 | Brooksby | 307—291 X |
| 3,408,512 | 10/1968 | Raisanen | 307—273 |
| 2,776,382 | 1/1957 | Jensen | 307—97 |
| 3,194,977 | 7/1965 | Anzalone et al. | 307—88.5 |
| 3,235,787 | 2/1966 | Gordon et al. | 323—22 |
| 3,239,778 | 3/1966 | Rywak | 331—113 |
| 3,250,922 | 5/1966 | Parham | 307—88.5 |
| 3,290,753 | 12/1966 | Chang | 29—25.3 |
| 3,335,340 | 8/1967 | Barson et al. | 317—235 |

JAMES D. KALLAM, Primary Examiner

U.S. Cl. X.R.

317—235